United States Patent
Kim et al.

(10) Patent No.: US 10,396,528 B2
(45) Date of Patent: Aug. 27, 2019

(54) LASER DEVICE AND METHODS FOR MANUFACTURING THE SAME

(71) Applicant: ELECTRONICS AND TELECOMMUNICATIONS RESEARCH INSTITUTE, Daejeon (KR)

(72) Inventors: In Gyoo Kim, Daejeon (KR); Gyungock Kim, Daejeon (KR); Sang Hoon Kim, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 16/030,417

(22) Filed: Jul. 9, 2018

(65) Prior Publication Data

US 2018/0331504 A1 Nov. 15, 2018

Related U.S. Application Data

(62) Division of application No. 15/230,313, filed on Aug. 5, 2016, now abandoned.

(30) Foreign Application Priority Data

Apr. 6, 2016 (KR) .................. 10-2016-0042487

(51) Int. Cl.
*H01S 5/02* (2006.01)
*H01S 5/04* (2006.01)
(Continued)

(52) U.S. Cl.
CPC ............ *H01S 5/3223* (2013.01); *H01S 5/021* (2013.01); *H01S 5/041* (2013.01); *H01S 5/0425* (2013.01);
(Continued)

(58) Field of Classification Search
CPC ...... H01S 5/3223; H01S 5/3224; H01S 5/105; H01L 21/31105–31116
See application file for complete search history.

(56) References Cited

U.S. PATENT DOCUMENTS

| 6,711,200 B1 * | 3/2004 | Scherer | ................. B82Y 20/00 372/19 |
| 2008/0031297 A1 * | 2/2008 | Uchida | ................. B82Y 20/00 372/45.01 |

(Continued)

FOREIGN PATENT DOCUMENTS

| KR | 1020140057536 A | 5/2014 |
| WO | 2013004241 A1 | 1/2013 |

OTHER PUBLICATIONS

Rodolfo E. Camacho-Aguilera et al., "An electrically pumped germanium laser", Optics Express, May 7, 2012, pp. 11316-11320, vol. 20, No. 10.

(Continued)

*Primary Examiner* — Xinning(Tom) Niu
*Assistant Examiner* — Sean P Hagan

(57) ABSTRACT

Provided is a laser device according to an embodiment of the inventive concept. The laser device includes: a semiconductor substrate; a germanium single crystal layer on the semiconductor substrate; and a pumping light source disposed on the germanium single crystal layer and configured to emit light toward the germanium single crystal layer, wherein the germanium single crystal layer receives the light to thereby output laser.

10 Claims, 15 Drawing Sheets

(51) Int. Cl.
*H01S 5/10* (2006.01)
*H01S 5/30* (2006.01)
*H01S 5/32* (2006.01)
*H01S 5/40* (2006.01)
*H01S 5/042* (2006.01)
*H01S 5/187* (2006.01)

(52) U.S. Cl.
CPC .............. *H01S 5/105* (2013.01); *H01S 5/187* (2013.01); *H01S 5/3086* (2013.01); *H01S 5/3224* (2013.01); *H01S 5/4006* (2013.01); *H01S 5/0424* (2013.01)

(56) References Cited

U.S. PATENT DOCUMENTS

| | | |
|---|---|---|
| 2013/0202005 A1 | 8/2013 | Dutt |
| 2014/0105235 A1 | 4/2014 | Kim et al. |
| 2014/0247853 A1* | 9/2014 | Deppe .................. H01S 5/18308 372/50.11 |
| 2015/0146755 A1 | 5/2015 | Kim et al. |
| 2015/0372454 A1* | 12/2015 | Guilloy .................. H01S 5/105 372/45.01 |

OTHER PUBLICATIONS

Jifeng Liu et al., "Band-Engineered Ge-on-Si Lasers", IEEE, 2010, pp. 146-149, vol. 10, IEEE.

Lee Carroll, et al., "Direct-Gap Gain and Optical Absorption in Germanium Correlated to the Density of Photoexcited Carriers, Doping, and Strain", Physical Review Letters, Aug. 3, 2012, pp. 057402-1-057402-5, vol. 109, No. 057402, American Physical Society.

Satoshi Iwamoto, et al., "Enhancement of Light Emission from Silicon by Utilizing Photonic Nanostructures", IEICE Trans. Electron, Feb. 2012. pp. 206-212. vol. E95-C, No. 2.

Shinichi Saito et al., "Group IV light sources to enable the convergence of photonics and electronics", Frontiers in materials, Sep. 17, 2014, pp. 1-15, vol. 1, No. 15.

* cited by examiner

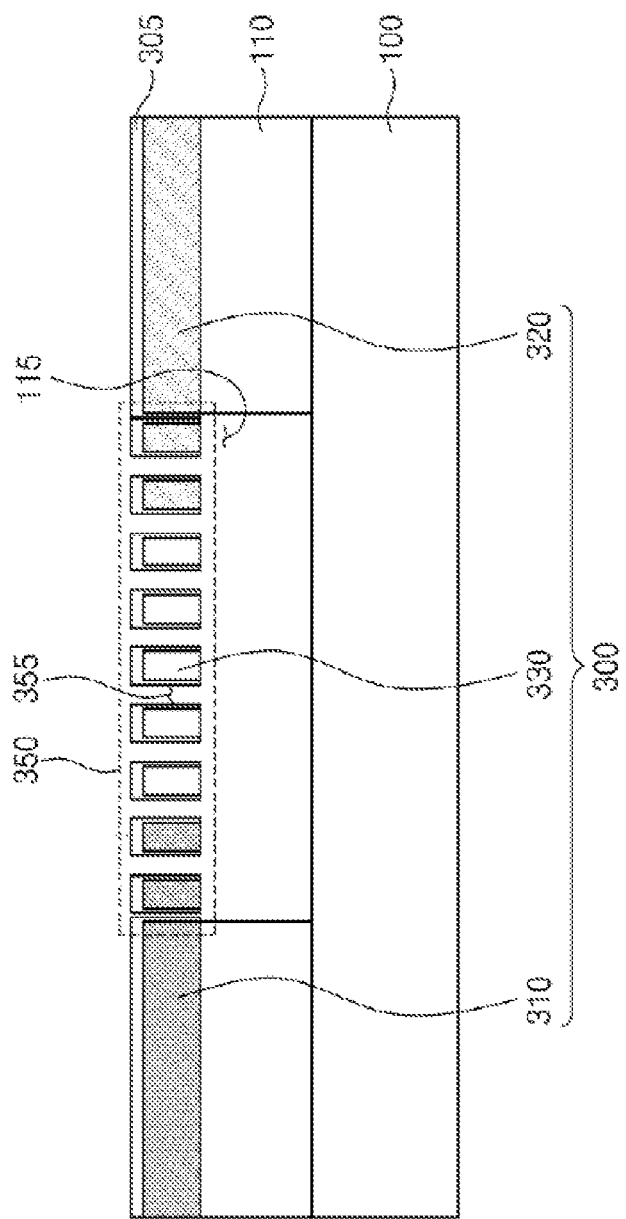

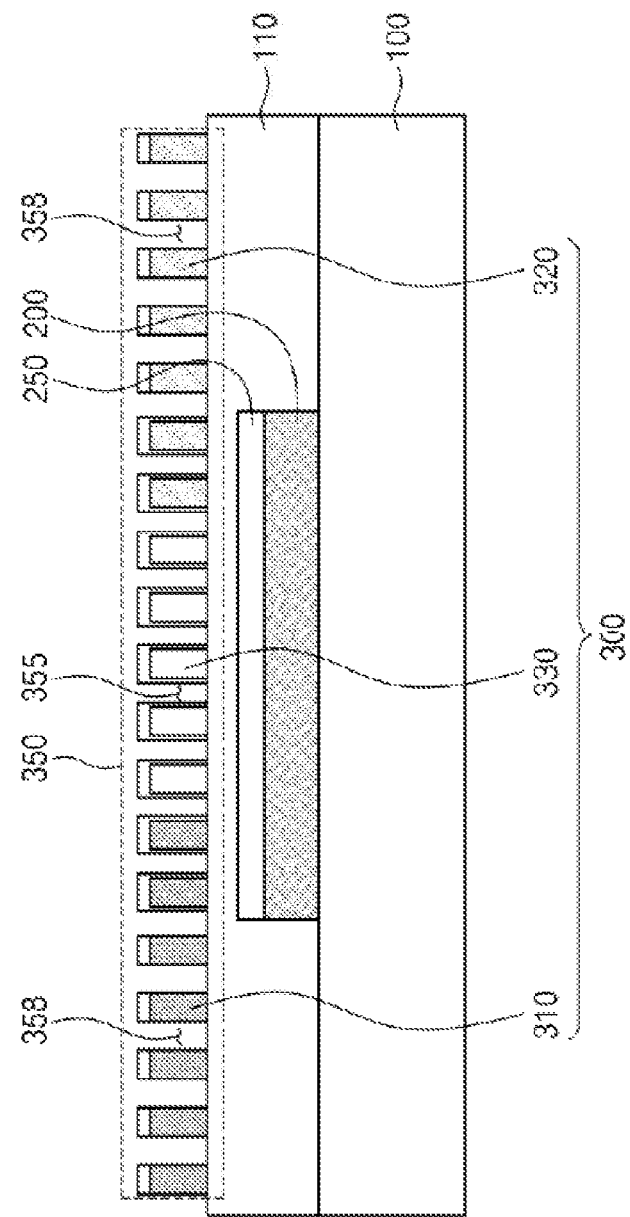

LASER DEVICE AND METHODS FOR MANUFACTURING THE SAME

CROSS-REFERENCE TO RELATED APPLICATION

This U.S. non-provisional patent application is a divisional of U.S. patent application Ser. No. 15/230,313 filed Aug. 5, 2016, which claims priority under 35 U.S.C. § 119 of Korean Patent Application No. 10-2016-0042487, filed on Apr. 6, 2016, the entire contents of which are hereby incorporated by reference.

BACKGROUND

The present disclosure herein relates to a laser device, and more particularly, to a laser device and methods for manufacturing the same, in which an optical resonator including a pumping light source and a gain medium is integrated on a single substrate.

As data transmission speeds, power consumption, and the like have faced limitations in fields related to semiconductor memories and CPU chips, a technology of implementing light interconnection capable of transmitting/receiving data through light on a silicon wafer has been attracting attention. Thus, active devices such as optical transmitters or optical receivers and optical passive devices such as optical distributors have reached an application phase through a lot of research and development.

SUMMARY

The present disclosure provides a laser device and a method for manufacturing the same in which a pumping light source and a germanium (Ge) single crystal layer which is a gain medium having a shape of an optical resonator are monolithically integrated.

An embodiment of the inventive concept provides a laser device. The laser device includes: a semiconductor substrate; a germanium single crystal layer on the semiconductor substrate; and a pumping light source disposed on the germanium single crystal layer to emit light toward the germanium single crystal layer, wherein the germanium single crystal layer receives the light to thereby output laser.

In an embodiment, the pumping light source may be a silicon photonic crystal structure having a plurality of holes.

In an embodiment, the laser device may further include a first oxide film disposed between the pumping light source and the semiconductor substrate to cover the germanium single crystal layer; and a second oxide film covering the pumping light source and filling the gap between the plurality of holes. The refractive indexes of the first and second oxide films may be smaller than that of silicon.

In an embodiment, the holes may be designed to output light of target wavelength of the pumping light source, and may be disposed such that the outputted light may vertically irradiate the germanium single crystal layer.

In an embodiment, the pumping light source may include first and second regions which are doped with impurities different from each other.

In an embodiment, the laser device may further include a first electrode connected with the semiconductor substrate; a second electrode connected with the germanium single crystal layer; a third electrode connected with the first region; and a fourth electrode connected with the second region.

In an embodiment, the laser device may further include an electrode junction layer disposed on the germanium single crystal layer to contact the second electrode, wherein the electrode junction layer has a doping type which is different from that of the semiconductor substrate and is the same as that of the germanium single crystal layer.

In an embodiment, the semiconductor substrate may be a silicon layer (lower semiconductor layer) under a buried oxide (BOX) layer of a silicon-on-insulator (SOI) substrate.

An embodiment of the inventive concept provides a method for manufacturing a laser device. A method for manufacturing a laser device includes: providing a substrate having a lower semiconductor layer, an upper semiconductor layer, and a first oxide film disposed between the lower and upper semiconductor layers; forming first and second regions which have doping types different from each other by implanting impurities into the upper semiconductor layer; forming a silicon photonic crystal structure having a plurality of holes by etching the upper semiconductor layer; forming an opening exposing the lower semiconductor layer by removing the first oxide film disposed under the silicon photonic crystal structure; and forming a germanium single crystal layer in the opening.

In an embodiment, the forming of the germanium single crystal layer may include: forming a second oxide film covering the silicon photonic crystal structure and a portion of the lower semiconductor layer exposed through the opening; forming a mask pattern on the silicon photonic crystal structure; removing the second oxide film covering a portion of the lower semiconductor layer through an etching process; and growing the germanium single crystal layer in the opening.

In an embodiment, the growing of the germanium single crystal layer may include a reduced pressure chemical vapor deposition (RPCVD) process, a low pressure chemical vapor deposition (LPCVD) process, or an ultra-high vacuum chemical vapor deposition (UHVCVD) process, wherein a process gas used during the growing of the germanium single crystal layer passes through the holes to move into the opening.

In an embodiment, the method for manufacturing a laser device may further include forming: a first electrode connected with the semiconductor substrate; a second electrode connected with the germanium single crystal layer; a third electrode connected with the first region; and a fourth electrode connected with the second region.

In an embodiment, the forming of the first to fourth electrodes may include: forming a third oxide film configured to fill the holes and covers the silicon photonic crystal structure; forming a first contact hole exposing a portion of an upper surface of the lower semiconductor layer; forming a second contact hole exposing a portion of an upper surface of the germanium single crystal layer; forming third and fourth contact holes which respectively expose portions of upper surfaces of the first and second regions; and filling a conductive material into the first to fourth contact holes.

In an embodiment, the method for manufacturing a laser device may further include forming an electrode junction layer on the germanium single crystal layer, wherein the second electrode may contact the electrode junction layer.

In an embodiment, the silicon photonic crystal structure may include first and second holes.

BRIEF DESCRIPTION OF THE FIGURES

Embodiments of the inventive concept are illustrated not as a limiting means but as an example, and in the accompanying drawings, like numbers refer to like elements. The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIGS. 3A to 3L are cross-sectional views illustrating a method for manufacturing a laser device according to an embodiment of the inventive concept.

DETAILED DESCRIPTION

Figure 1:
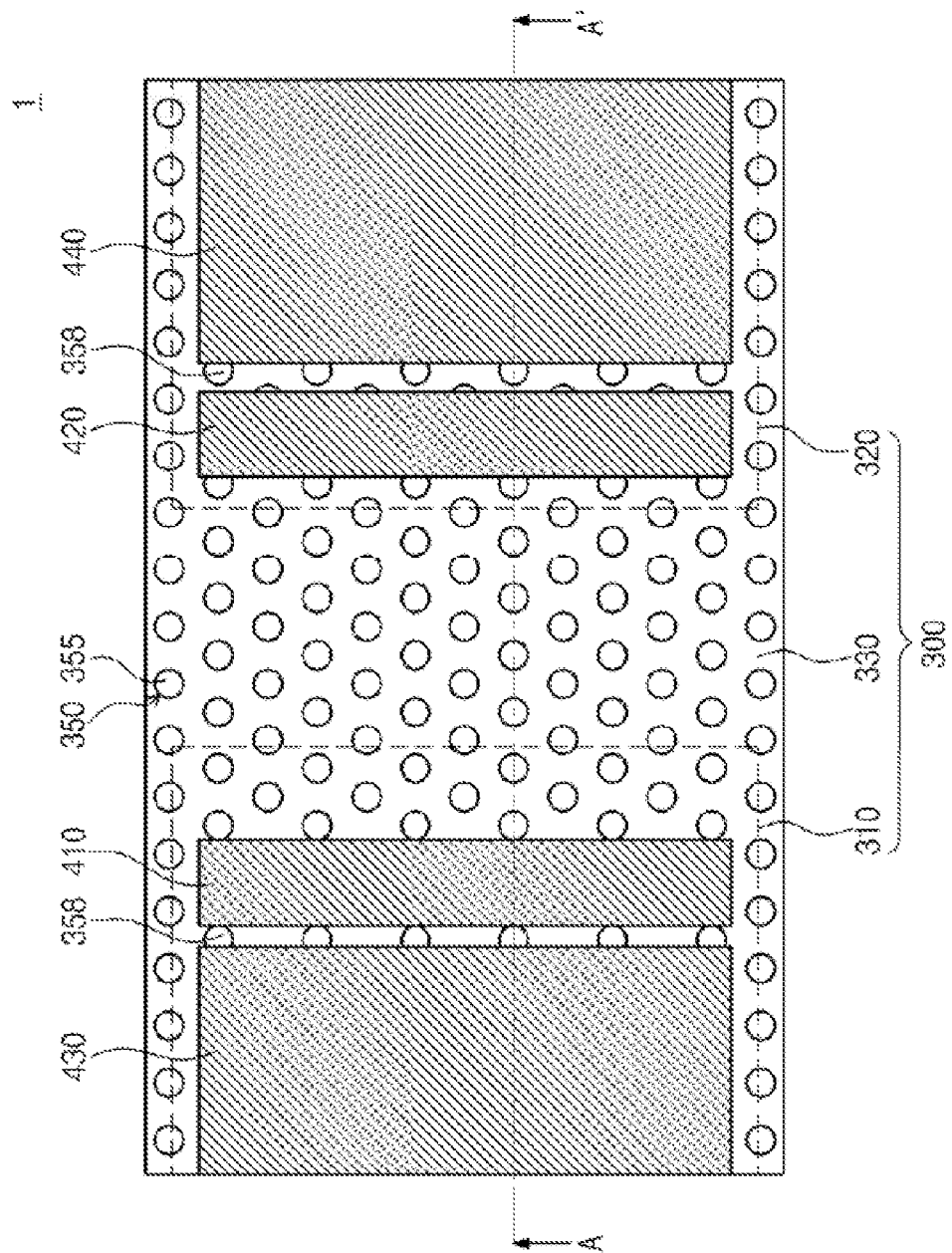
FIG. 1 is a plan view illustrating a laser device according to an embodiment of the inventive concept.

Advantages and features of the present invention, and implementation methods thereof will be clarified through the following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. Like reference numerals refer to like elements throughout.

Additionally, the embodiment in the detailed description will be described with sectional views as ideal exemplary views of the present invention. In the figures, the dimensions of layers and regions are exaggerated for clarity of illustration. Accordingly, shapes of the exemplary views may be modified according to manufacturing techniques and/or allowable errors. Therefore, the embodiments of the present disclosure are not limited to the specific shape illustrated in the exemplary views, but may include other shapes that may be created according to manufacturing processes. For example, an etched region illustrated as a rectangle may have rounded or curved features. Areas exemplified in the drawings have general properties, and are used to illustrate a specific shape of a semiconductor package region. Thus, this should not be construed as limited to the scope of the present invention.

Figure 2:
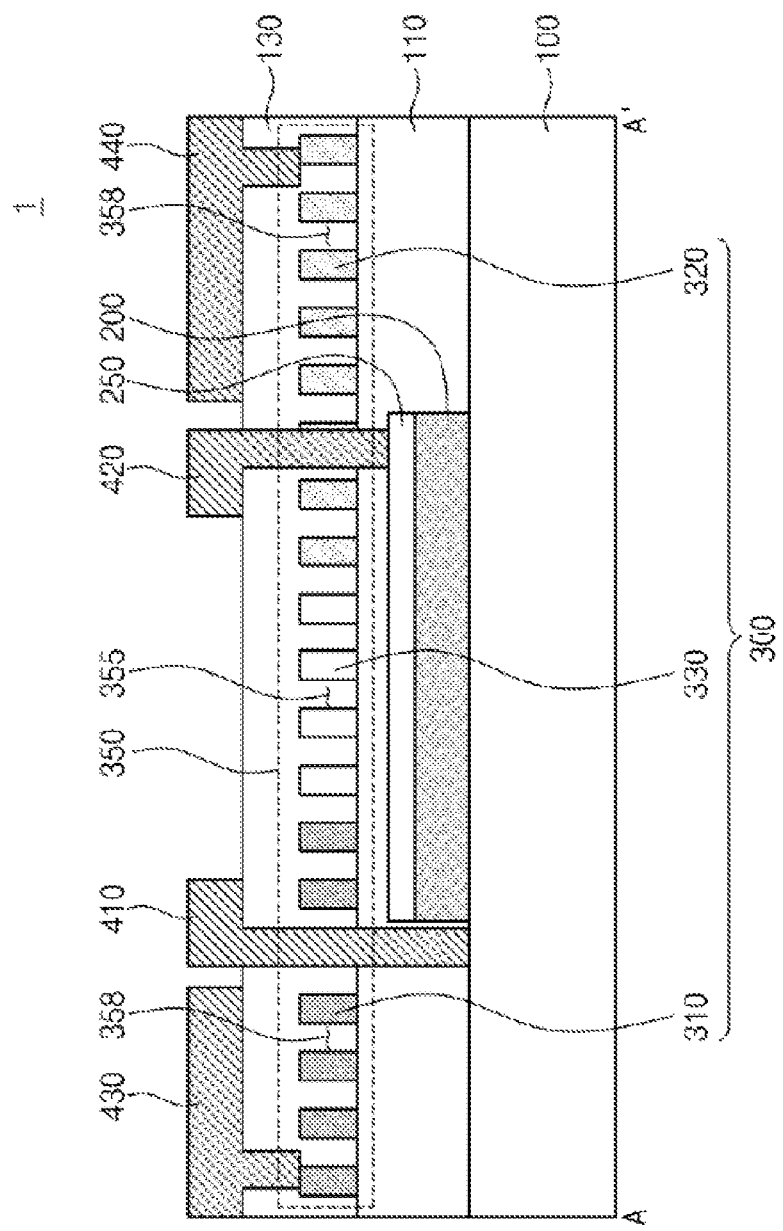
FIG. 2 is a cross-sectional view illustrating a laser device according to an embodiment of the inventive concept.

FIG. 1 is a plan view illustrating a laser device according to an embodiment of the inventive concept, and FIG. 2 is a cross-sectional view illustrating a laser device according to an embodiment of the inventive concept.

Referring to FIGS. 1 and 2, a laser device 1 may include a semiconductor substrate 100, a germanium single crystal layer 200, a pumping light source 300, and electrodes 410, 420, 430 and 440.

The semiconductor substrate 100 may include silicon. The semiconductor substrate 100 may be doped as a first conductive type material. For example, the semiconductor substrate 100 may be doped with N-type impurities or P-type impurities.

The germanium single crystal layer 200 may be disposed on the semiconductor substrate 100. The germanium single crystal layer 200 may function as an optical resonator. The germanium single crystal layer 200 may confine the light generated therein due to the refractive index thereof higher than that of the semiconductor substrate 100 and may thereby make the light oscillate as a laser. An electrode junction layer 250 may be disposed on the germanium single crystal layer 200. The electrode junction layer 250 may be the germanium single crystal layer or a silicon single crystal (or polycrystalline) layer. The electrode layer 250 is doped as a second conductive type material different from the first conductive type material. That is, when the semiconductor substrate 100 is doped with N-type impurities, the electrode junction layer 250 may be doped with P-type impurities, and when the semiconductor substrate 100 is doped with the P-type impurities, the electrode junction layer 250 may be doped with N-type impurities. On the germanium single crystal layer 200, N-type impurities may be doped in a high level to overcome an indirect transition characteristic of an energy band diagram.

The first oxide film 110 may be disposed on the semiconductor substrate 100. The germanium single crystal layer 200 may be disposed at a place in which a first oxide film 110 is partially etched, and a second oxide film 130 may cover the germanium single crystal layer 200 and an electrode junction layer 250. The first oxidation layer 110 may be a silicon oxide film ($SiO_2$), and the second oxide film 130 may be a silicon oxidation ($SiO_2$) film.

The pumping light source 300 may be disposed on the first oxide film 110 and may be disposed over the germanium single crystal layer 200. The pumping light source 300 may emit light toward the germanium single crystal layer 200. The pumping light source 300 may be silicon.

The pumping light source 300 may include a first region 310 doped in a third conductive type material, a second region 320 doped in a fourth conductive type material, and an intrinsic third region For example, the first region 310 may be doped as a doping type different from that of the second region 320. That is, the third and fourth conductive type materials may be different. For example, when the first region 310 is doped with N-type impurities, the second region 320 may be doped with P-type impurities, and when the first region 310 is doped with P-type impurities, the second region 320 may be doped with N-type impurities. The third region 330 may be disposed between the first and second regions 310 and 320. The third region 330 may vertically overlap the germanium single crystal layer 200 and the electrode junction layer 250

The pumping light source 300 may include a silicon photonic crystal structure 350 in which a plurality of holes 355 and 358 are provided. When viewed in a plane, the holes 355 and 358 may include first holes 355 disposed at the central portion of the pumping light source 300 and second holes 358 disposed at the edge portions of the pumping light source 300. The first holes 355 may vertically overlap the germanium single crystal layer 200 and the electrode junction layer 250, and a portion of the second holes 358 may vertically overlap a third electrode 430 and a fourth electrode 440. The second oxide film 130 may fill the gaps between the first holes 355 and second holes 358 and disposed on the pumping light source 300. The second oxide film 130 may be a silicon oxide ($SiO_2$) film. The silicon oxide ($SiO_2$) film filling the gaps between the holes 355 and 358 may have a smaller refractive index than the silicon photonic crystal structure 350.

As a PN junction is formed between the first and second regions 310 and 320, light may be generated between the first and second regions 310 and 320. The light may be diffracted between the silicon oxide ($SiO_2$) film provided between the holes 355 and 358 and the silicon constituting the silicon photonic crystal structure 350. As the diffraction of the light generated from the pumping light source 300 is increased, light extraction efficiency may be increased.

Electrodes 410, 420, 430, and 440 may be connected to the semiconductor substrate 100, the electrode junction layer 250, and the pumping light source 300. The electrodes 410, 420, 430, and 440 may include: the first electrode 410 connected to the semiconductor substrate 100, the second electrode 420 connected to the electrode junction layer 250, the third electrode 430 connected to the first region 310 of the pumping light source 300, and the fourth electrode 440 connected to the second region 320 of the pumping light source 300. The first electrode 410 may extend toward the semiconductor substrate 100 on the second oxide film 130, the second electrode 420 may extend toward the electrode junction layer 250 on the second oxide film 130, the third electrode 430 may extend toward the first region 310 on the second oxide film 130, and the fourth electrode 440 may extend toward the second region 320 on the second oxide film 130. The first to fourth electrodes 410, 420, 430, and 440 may be disposed while being spaced apart from each other. The first to fourth electrodes 410, 420, 430, and 440 may be a multi-layered film comprising a metal such as platinum (Pt)/gold (Au), titanium (Ti)/aluminum (Al), gold (Au)/aluminum (Al), or nickel (Ni)/aluminum (Al).

In the laser device 1 according to an embodiment of the inventive concept, the germanium mono crystal layer 200 which is an optical resonator and the pumping light source 300 may be monolithically integrated on the single semiconductor substrate 100. Thus, optical interconnection in which light may be effectively transmitted and received to/from other optical devices provided on the semiconductor substrate 100 may be implemented.

Also, the germanium single crystal layer 200 may receive the light outputted from the pumping light source 300. When the germanium single crystal layer 200 is grown on the semiconductor substrate 100 composed of silicon, a tensile strain is generated due to the difference in lattice constants between silicon and germanium. The energy band structure of the germanium single crystal layer 200 is deformed by the tensile strain, and electron-hole pairs may be formed in the germanium single crystal layer 200 by the light irradiating the germanium single crystal layer 200. Here, when power is supplied to the germanium single crystal layer 200, electrons present inside the germanium single crystal layer 200 can be directly transited from a valence band to a conduction band capable of generating a radiative transition. Laser can be efficiently outputted from the germanium single crystal layer 200 by increasing the light emitting efficiency through this direct transition. The laser outputted from the germanium single crystal layer 200 may have the longer wavelength than the light outputted from the pumping light source 300.

FIGS. 3A to 3L are cross-sectional views illustrating a method for manufacturing a laser device according to an embodiment of the inventive concept. For convenience of description, descriptions overlapping with FIGS. 1 and 2 will not be provided.

Figure 3A:
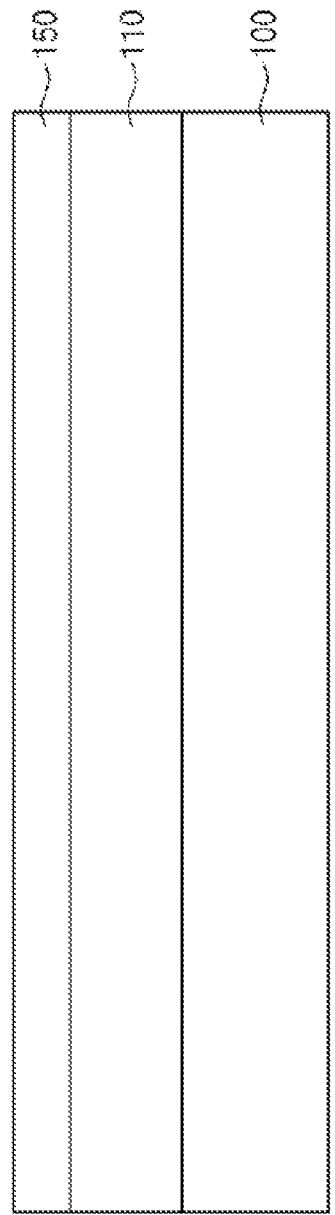

Referring to FIG. 3A, a silicon-on-insulator (SOI) in which a semiconductor substrate 100, a first oxide film 110, and a semiconductor layer 150 are combined may be provided. The first oxide film 110 and the semiconductor layer 150 may be sequentially laminated on the semiconductor substrate 100. The semiconductor substrate 100 and the semiconductor layer 150 may be silicon, and the first oxide film 110 may be a silicon oxide ($SiO_2$) film.

Figure 3B:
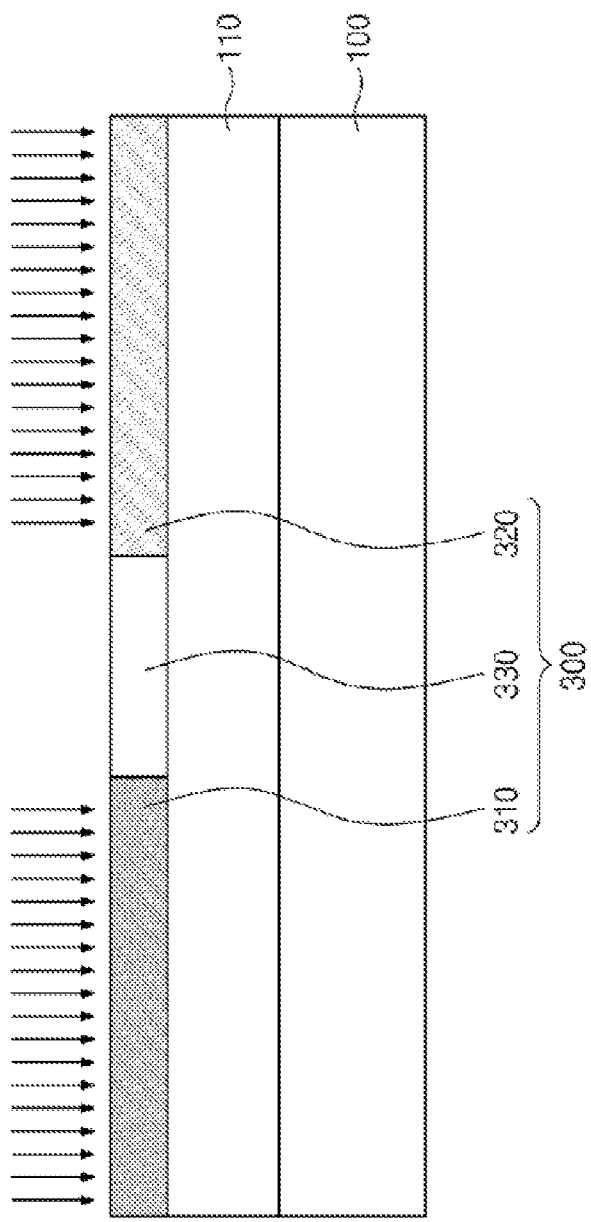

Referring to FIG. 3B, impurities are implanted into the semiconductor layer (150 of FIG. 3A) and a pumping light source 300 may thereby be formed. A first region 310 may be formed by implanting first impurities having a first conductive type material into a portion of the semiconductor layer (150 of FIG. 3A) and a second region 320 may be formed by implanting second impurities having a second conductive type material into a portion of the semiconductor layer (150 of FIG. 3A). The first and second conductive type materials may have doping type materials different from each other. For example, the first conductive type material may be a P-type material, and the second conductive type material may be an N-type material. In another example, the first conductive type material may be an N-type material, and the second conductive type material may be a P-type material. The first impurities may be boron (B), boron fluoride ($BF_2$), indium (In), or diborane ($B_2H_6$), and the second impurities may be arsenic (As), phosphorus (P), or phosphine ($PH_3$). The region in which impurities are not implanted may be a third region 330.

Figure 3C:
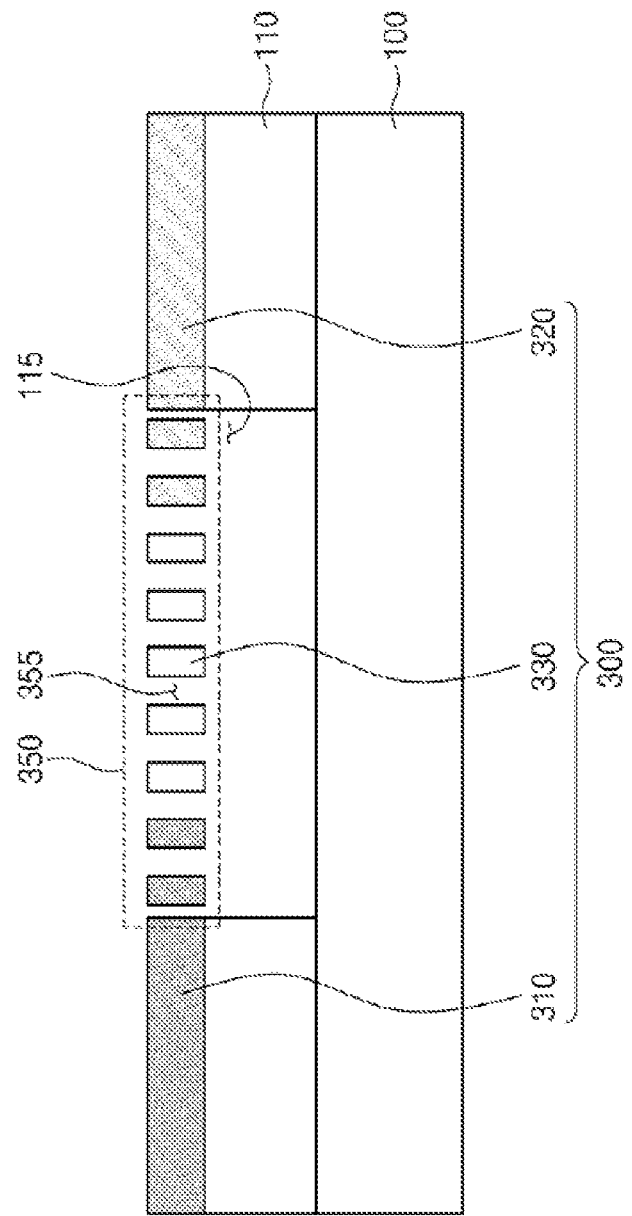

Referring to FIG. 3C, a silicon photonic crystal structure 350 having a plurality of first holes 355 may be formed. The silicon photonic crystal structure 350 may be formed in such a way that a first mask pattern (not shown) is formed on the pumping light source 300 through a photolithography process and a portion of the pumping light source 300 is dry-etched. For example, the dry etching process may be a reactive ion etch (RIE) process or an inductively coupled plasma (ICP) process. The silicon photonic crystal structure 350 may be formed at a central portion of the pumping light source 300.

After forming the silicon photonic crystal structure 350, an opening 115 may be formed by etching the first oxide film 110. For example, the etching process may be a gas phase etching (GPE) process. The opening 115 may expose the upper surface of the semiconductor substrate 100. After forming the opening 115, the first mask pattern (not shown) may be removed.

Figure 3D:
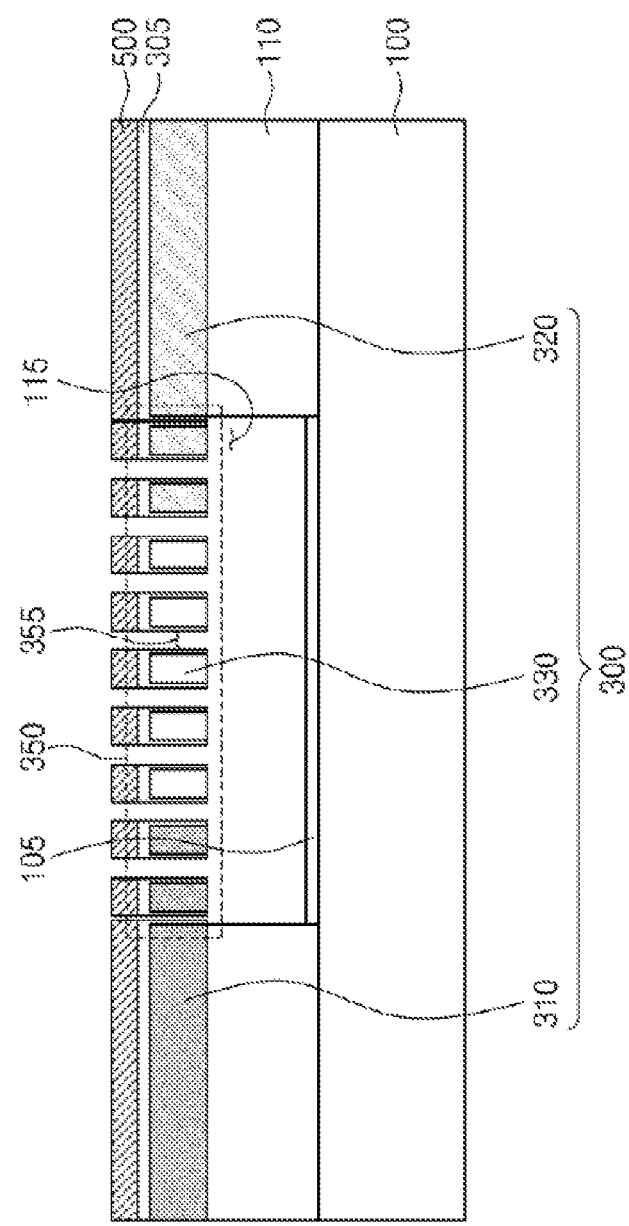

Referring to FIG. 3D, silicon oxide films 105 and 305 may be formed through a thermal oxidation process on the surfaces of the semiconductor substrate 110 and the pumping light source 300 which are exposed to air. Subsequently, a second mask pattern 500 may be formed on the pumping light source 300 through a photolithography process. Through the above-mentioned processes, the upper surface of the semiconductor 100, the upper surface of the pumping light source 300, and exposed side walls of holes 355 may be covered with the silicon oxide films 105 and 305.

Referring to FIG. 3E, the silicon oxide film 105 covering the upper surface of the semiconductor substrate 100 may be removed. The silicon oxide film 105 may be removed through a gas phase etching (GPE) process. After removing silicon oxide film 105, the second mask pattern 500 may be removed.

Figure 3F:
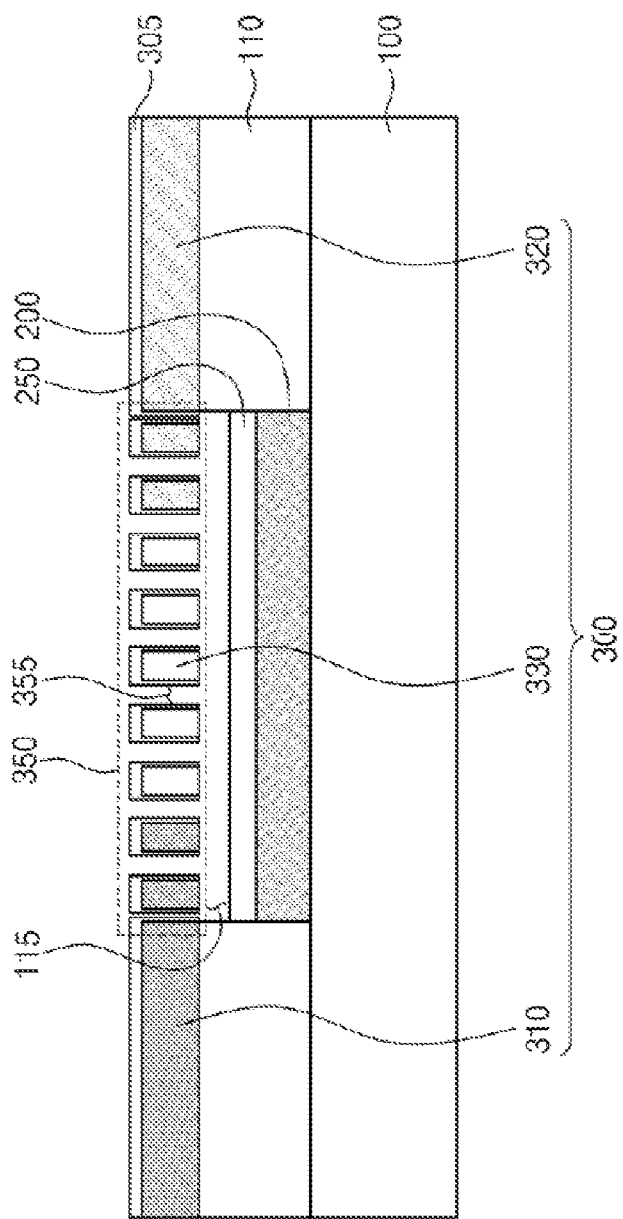

Referring to FIG. 3F, a germanium single crystal layer 200 may be formed through selective epitaxial growth (SEG). The germanium single crystal layer 200 may fill a lower portion of the opening 115. The opening 115 may define a selective epitaxial growth region. The selective epitaxial growth may be implemented through a reduced pressure chemical vapor deposition (RVCVD) method, a low pressure chemical vapor deposition (LPCVD) method, or an ultra-high vacuum chemical vapor deposition (UHVCVD) method. The selective epitaxial growth may use germane ($GeH_4$) as a process gas and use hydrogen gas as a carrying gas. The process gas may pass through the holes 355 of the silicon photonic crystal structure 350 to move into the opening 115.

After forming the germanium single crystal layer 200, an electrode junction layer 250 may be formed on the germanium single crystal layer 200 through the selective epitaxial growth (SEG). The electrode junction layer 250 may be formed through the same process as the germanium single crystal layer 200.

Figure 3G:
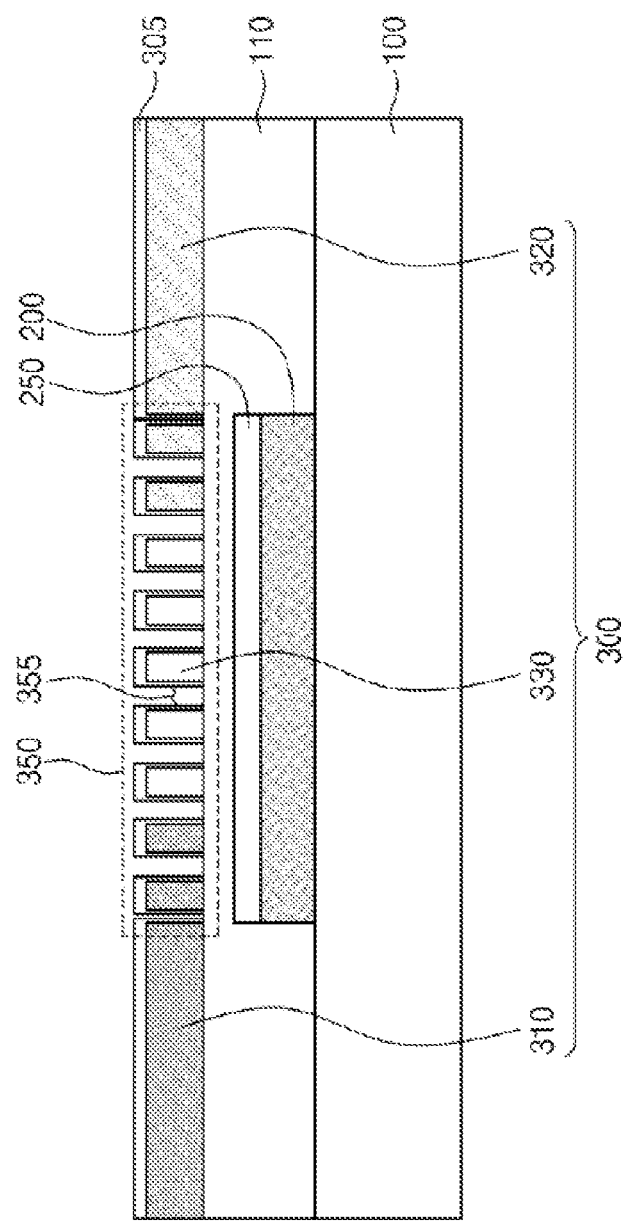

Referring to FIG. 3G, the opening 115 may be filled with an oxide film (not shown). The oxide film (not shown) may be the same material as the first oxide film 110, for example, may be silicon oxide ($SiO_2$) film. Thus, the silicon photonic crystal structure 350 may be supported by the first oxide film 110.

Figure 3H:
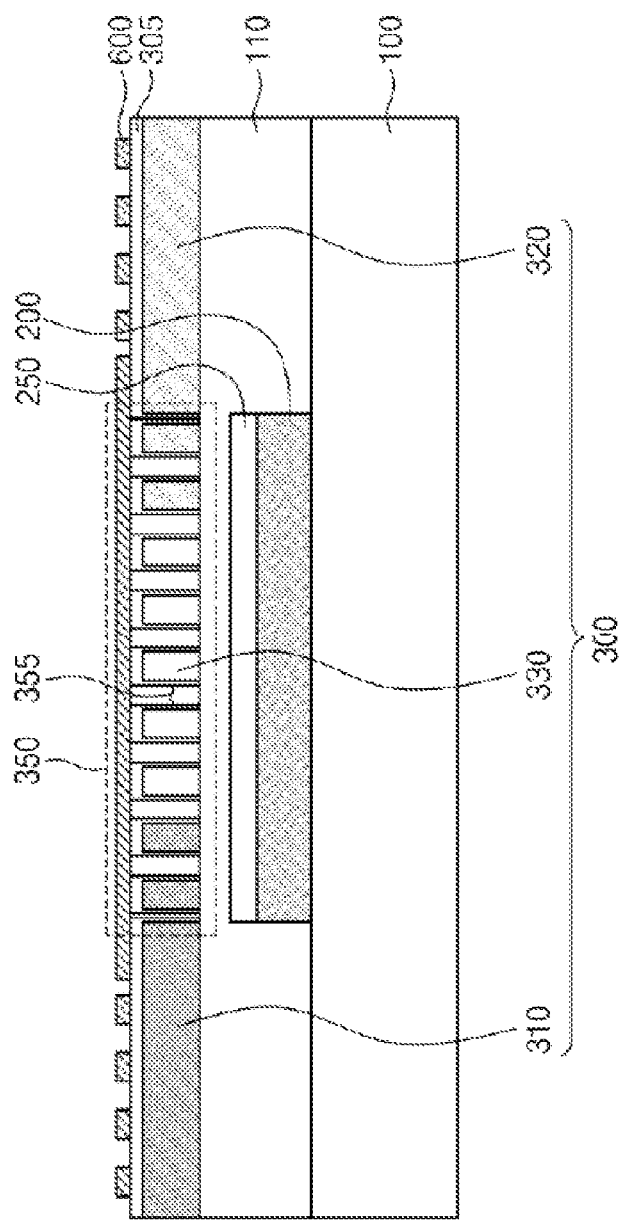

Referring to FIG. 3H, a third mask pattern 600 may be formed on the pumping light source 300 through a photolithography process. The third mask pattern 600 may be disposed on the silicon photonic crystal structure 350 such that the first holes 355 are not exposed to the outside, and may be disposed on the first and second regions 310 and 320 in which the holes are not formed.

Referring to FIG. 3I, second holes 358 may be formed by dry-etching edge portions of the pumping light source 300. For example, the dry etching process may be a reactive ion etch (RIE) process or an inductively coupled plasma (ICP) process. Thus, the silicon photonic crystal structure 350 may include the first holes 355 disposed at a central portion and the second holes 358 disposed on edge portions.

Figure 3J:
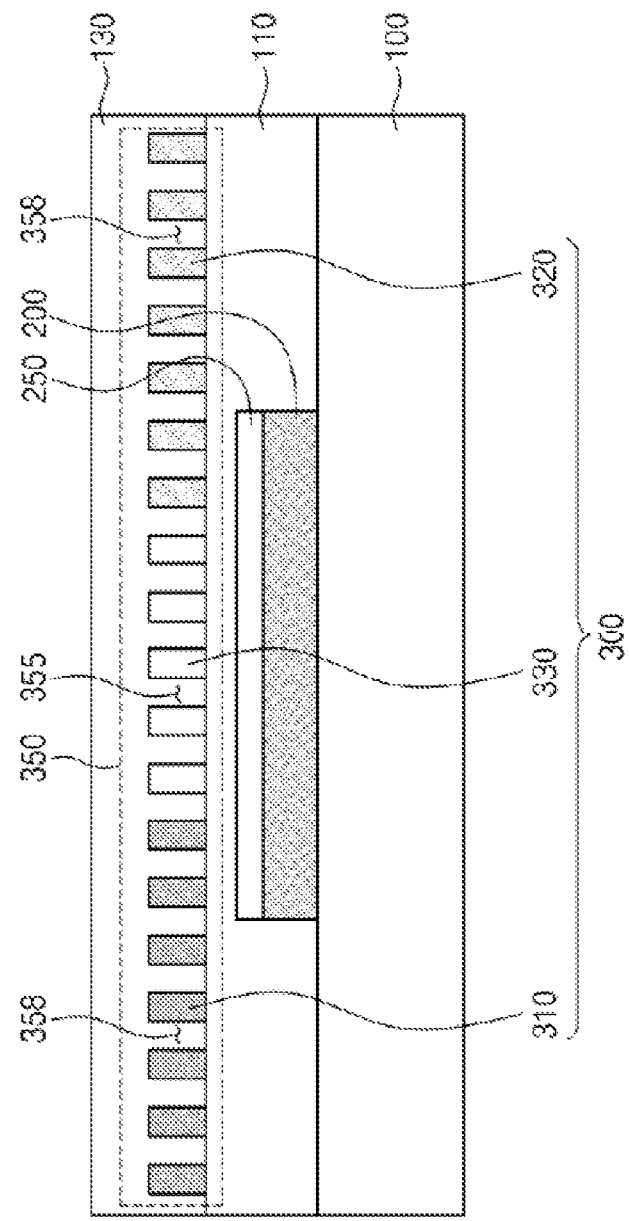

Referring to FIG. 3J, a second oxide film 130 which fills the first and second holes 355 and 358, and covers the silicon photonic crystal structure 350 may be formed. The second oxide film (130) may be the same material as the silicon oxide film (see 305 of FIG. 3G), for example, may be a silicon oxide ($SiO_2$) film. As the silicon oxide ($SiO_2$) film having a refractive index smaller than silicon is filled between the first and second holes 355 and 358, the amount of light diffraction may be increased between the first holes 355, the second holes 358 and the second oxide film 130.

Figure 3K:
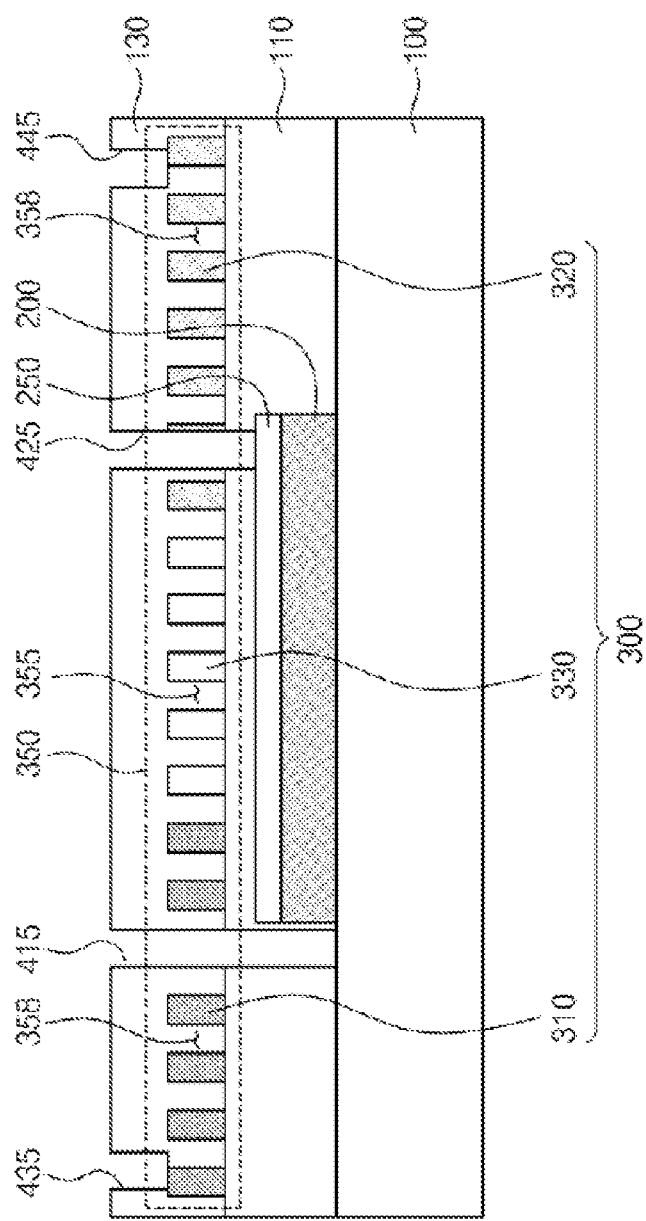

Referring to FIG. 3K, a first contact hole 415 exposing a portion of the upper surface of the semiconductor substrate 100, a second contact hole 425 exposing a portion of the upper surface of the electrode junction layer 250, a third contact hole 435 exposing a portion of the upper surface of the first region 310, and a fourth contact hole 445 exposing a portion of the upper surface of the second region 320 may be formed. The first to fourth contact holes 415, 425, 435, and 445 may be formed through a dry-etching process. For example, the dry etching process may be a reactive ion etch (RIE) process or an inductively coupled plasma (ICP) process. The first contact hole 415 may pass through the first oxide film 110, the first region 310, and the second oxide film 130. The second contact hole 425 may pass through a portion of the second oxide film 130, the second region 320, and a portion of the first oxide film 110. The third contact hole 435 and the fourth contact hole 445 may pass through the second oxide film 130.

Figure 3L:
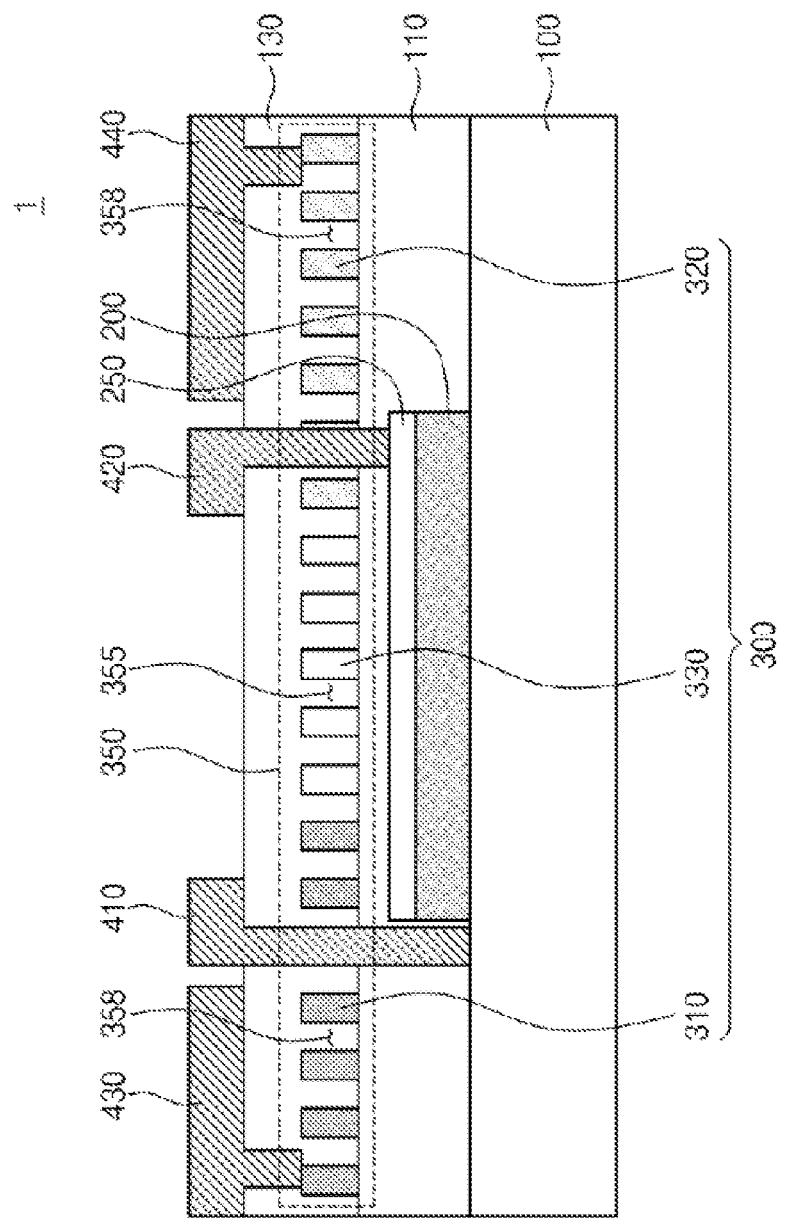

Referring to FIG. 3L, the first to fourth electrodes 410, 420, 430, and 440 may be formed by filing a conductive material in the first to fourth contact holes 415, 425, 435, and 445. The conductive material may be a metallic material such as platinum (Pt)/gold (Au), titanium (Ti)/aluminum (Al), gold (Au)/aluminum (Al), or nickel (Ni)/aluminum (Al). The laser device 1 may be manufactured by forming the first to fourth electrodes 410, 420, 430, and 440.

According to an embodiment of the inventive concept, the laser device 1 may be manufactured by growing the germanium single crystal layer 200 through selective epitaxial growth by using the first oxide film (buried oxide layer) in a silicon-on-insulator (SOI). In this case, processes for depositing and patterning a separate mask layer to form a selective epitaxial growth region of the germanium single crystal layer 200 may not be provided. Thus, the manufacturing process of the laser device 1 may be simplified. Furthermore, since the pumping light source 300 manufactured by using silicon photonics technology may be formed on a silicon-on-insulator (SOI), a plurality of optical devices may be monolithically integrated on a single substrate.

Figure 4:
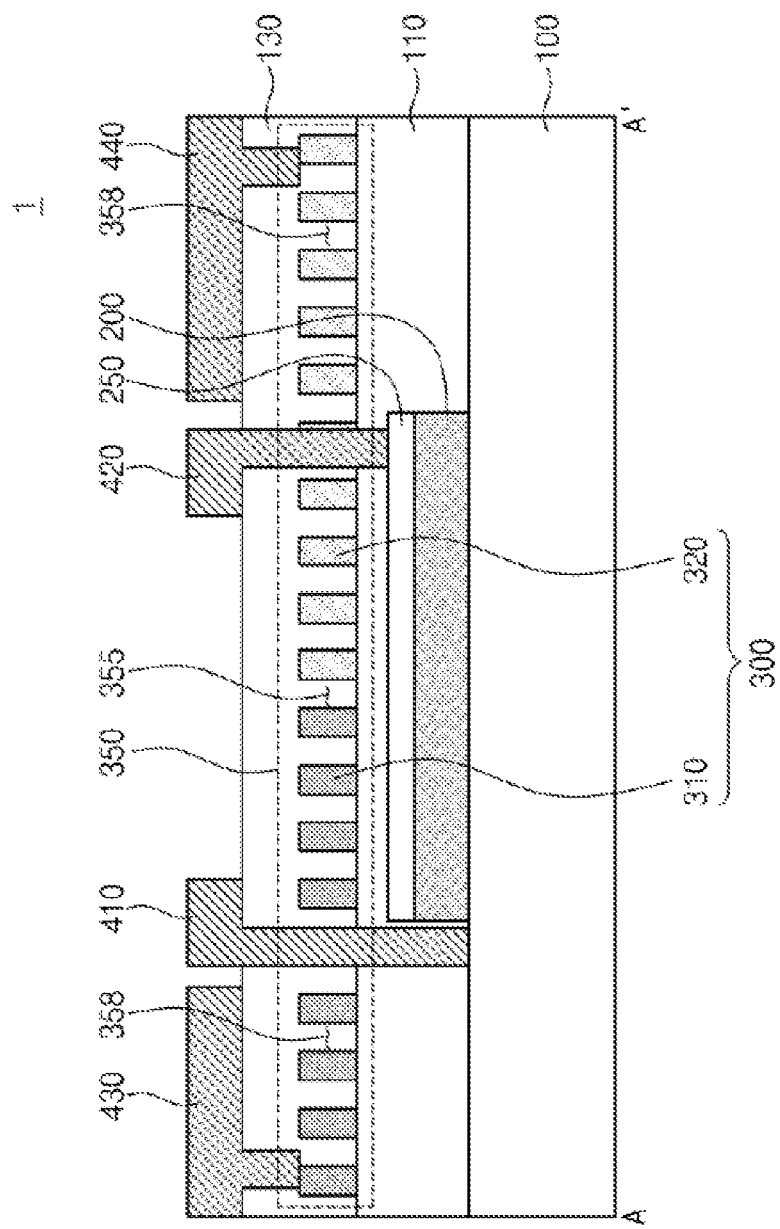
FIG. 4 is cross-sectional view illustrating a modified example according to embodiments of the inventive concept.

FIG. 4 is a cross-sectional view of a modified example of a display device according to an embodiment of the inventive concept. For convenience of description, descriptions overlapping with FIGS. 1 and 2 will not be provided.

Referring to FIG. 4, a laser device 1 may include a pumping light source 300 including a first region 310, and a second region 320. The first region 310 may be doped as a first conductive type material, and the second region 320 may be doped as a second conductive type material. The first and second conductive type materials may be different from each other. For example, the first region 310 may include N-type impurities, and the second region 320 may include P-type impurities. In another example, the first region 310 may include P-type impurities, and the second region 320 may include N-type impurities.

The border between the first and second regions 310 and 320 may be positioned over the germanium single crystal layer 200. That is, the border between the first and second regions 310 and 320 may vertically overlap the germanium single crystal layer 200 and the electrode junction layer 250.

Unlike the examples described above, the electrode junction layer 250 may be a silicon film or silicon-germanium alloy film. When the electrode layer 250 is a silicon film, dichlorosilane ($SiH_2Cl_2$), silicon tetrachloride ($SiCl_4$), or silane ($SiH_4$) may be used as a process gas. When the electrode layer 250 is a silicon-germanium compound film, silane ($SiH_4$) and germane ($GeH_4$) may be used as a process gas.

Also, the pumping light source 300 may be replaced with another certain type of diode (LED) devices for which an integration process can be performed in a complementary metal oxide semiconductor (CMOS) process.

According to embodiments of the inventive concept, a germanium single crystal layer may receive light emitted from a pumping light source and may thereby output laser with an improved intensity. The laser outputted from the germanium single crystal layer may have a longer wavelength than the light emitted from the pumping light source.

According to embodiments of the inventive concept, a pumping light source of a silicon photonic crystal structure including a plurality of holes are positioned on a germanium single crystal layer, so that the light efficiency of the pumping light emitted from the pumping light source may be increased.

According to embodiments of the inventive concept, the pumping light source and the germanium single crystal layer which is an optical resonator may be monolithically integrated on a single semiconductor substrate.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

Therefore, the above-described embodiments are illustrative in all the aspects, and should be construed as not being limitative.

What is claimed is:

1. A method for manufacturing a laser device, the method comprising:
   providing a substrate having a lower semiconductor layer, an upper semiconductor layer, and a first oxide film disposed between the lower and upper semiconductor layers;
   forming first and second regions which have doping types different from each other by implanting impurities into the upper semiconductor layer;
   forming a silicon photonic crystal structure having a plurality of holes by etching the upper semiconductor layer;
   forming an opening exposing the lower semiconductor layer by removing the first oxide film disposed under the silicon photonic crystal structure; and
   forming a germanium single crystal layer in the opening.

2. The method of claim 1, wherein the forming of the germanium single crystal layer comprises:
   forming a second oxide film covering the silicon photonic crystal structure and a portion of the lower semiconductor layer exposed through the opening;
   forming a mask pattern on the silicon photonic crystal structure;
   removing the second oxide film covering a portion of the lower semiconductor layer through an etching process; and
   growing the germanium single crystal layer in the opening.

3. The method of claim 2, wherein the growing of the germanium single crystal layer comprises a reduced pressure chemical vapor deposition (RPCVD) process, a low pressure chemical vapor deposition (LPCVD) process, or an ultra-high vacuum chemical vapor deposition (UHVCVD) process,
   wherein a process gas used during the growing of the germanium single crystal layer passes through the holes to move into the opening.

4. The method of claim 1, further comprising forming a first electrode connected with the semiconductor substrate, a second electrode connected with the germanium single crystal layer, a third electrode connected with the first region, and a fourth electrode connected with the second region.

5. The method of claim 4, wherein the forming of the first to fourth electrodes comprises:
   forming a third oxide film configured to fill the holes and covers the silicon photonic crystal structure;
   forming a first contact hole exposing a portion of an upper surface of the lower semiconductor layer;
   forming a second contact hole exposing a portion of an upper surface of the germanium single crystal layer;
   forming third and fourth contact holes which respectively expose portions of upper surfaces of the first and second regions; and
   filling a conductive material into the first to fourth contact holes.

6. The method of claim 4, further comprising forming an electrode junction layer on the germanium single crystal layer, wherein the second electrode contacts the electrode junction layer.

7. A method for manufacturing a laser device, comprising:
   providing a substrate having a lower semiconductor layer, an upper semiconductor layer, and a first oxide film disposed between the lower and upper semiconductor layers;
   implanting impurities having different conductive types into the upper semiconductor layer;
   forming a silicon photonic crystal structure having a plurality of first holes by etching a central region of the upper semiconductor layer;
   forming an opening exposing the lower semiconductor layer by removing the first oxide film disposed under the silicon photonic crystal structure;
   forming a germanium single crystal layer and an electrode junction layer on the germanium single crystal layer in the opening;
   forming a second oxide film filled between the silicon photonic crystal structure and the germanium single crystal layer;
   forming a plurality of second holes by etching a peripheral region of the upper semiconductor layer; and
   forming a third oxide film filled into the first and second holes which are formed on the central region and the peripheral region and configured to cover the upper semiconductor layer.

8. The method of claim 7, further comprising forming a first electrode connected with the lower semiconductor layer, a second electrode connected with the electrode junction layer, and third and fourth electrodes which are connected with the upper semiconductor layer,
   wherein a region at which the third electrode is in contact with the upper semiconductor layer has a different doping type from a region at which the fourth electrode is in contact with the upper semiconductor layer.

9. The method of claim 7, wherein the first holes vertically overlap the germanium single crystal layer.

10. The method of claim 7, wherein the silicon photonic crystal structure comprises the first holes and the second holes.

* * * * *